United States Patent [19]

Arakawa et al.

[11] 4,254,548
[45] Mar. 10, 1981

[54] METHOD OF FABRICATING ELECTRODE PLATE FOR SUPPORTING SEMICONDUCTOR DEVICE

[75] Inventors: Hideo Arakawa; Keiichi Kuniya; Masabumi Ohashi, all of Hitachi, Japan

[73] Assignee: Hitachi, Ltd., Tokyo, Japan

[21] Appl. No.: 37,025

[22] Filed: May 8, 1979

[30] Foreign Application Priority Data

May 10, 1978 [JP] Japan .................................. 53/54480

[51] Int. Cl.³ ............................................ H01R 43/02
[52] U.S. Cl. ........................................ 29/879; 29/589; 29/591
[58] Field of Search ................ 29/630 C, 591, 630 R, 29/589, 419 R, 879; 428/367; 75/229

[56] References Cited
U.S. PATENT DOCUMENTS 3,550,247 12/1970 Evans et al. ...................... 29/419 R
3,759,353 9/1973 Marin .................................. 428/367 X
3,918,141 11/1975 Pepper et al. ...................... 29/419 R
4,072,817 2/1978 Waite ............................. 29/630 C X
4,083,719 4/1978 Arakawa et al. ...................... 75/229

FOREIGN PATENT DOCUMENTS 489585 12/1973 U.S.S.R. .

Primary Examiner—Francis S. Husar
Assistant Examiner—C. J. Arbes
Attorney, Agent, or Firm—Craig & Antonelli

[57] ABSTRACT

A bundle of carbon fibers each coated with copper or copper alloy is uniformly wound around a core rod under tension, and subjected to a hot press treatment in a non-oxidizing atmosphere. The core rod is then cut off along the surface of a plate formed by the hot-press to form a supporting electrode plate for a semiconductor device. The electrode plate thus fabricated incorporates therein carbon fibers in a spiral and concentric circular array around the core rod.

11 Claims, 6 Drawing Figures

METHOD OF FABRICATING ELECTRODE PLATE FOR SUPPORTING SEMICONDUCTOR DEVICE

BACKGROUND OF THE INVENTION

The present invention relates in general to a supporting electrode plate adapted to be soldered to a semiconductor substrate. In particular, the invention concerns a method of fabricating a supporting electrode plate for a semiconductor device, which electrode is made of a composite material composed of copper (Cu) or a copper alloy (Cu-alloy) and carbon (C) fibers.

The material for the electrode plate adapted to be soldered to a semiconductor device or substrate thereof for supporting it is usually required to exhibit following properties.

(1) The thermal expansion coefficient of the electrode plate material has to be substantially equal to that of the semiconductor substrate to which the electrode is soldered.

(2) The electrode plate material has to exhibit excellent thermal and electrical conductivities.

The supporting electrode plate is bonded to an associated semiconductor substrate usually by soldering. Accordingly, when the thermal expansion coefficients of the materials for the electrode and the semiconductor device differ remarkably from each other, the material which is more fragile or of lower mechanical strength tends to undergo warp or destruction due to difference in the thermal expansion when the bonded portion is cooled after the soldering or when heat is generated during the operation of the semiconductor device. In the case where silicon (Si) is employed for the semiconductor material, the destruction or warp will take place in the thin layer of Si as a rule. As is well known, silicon or Si is a material exhibiting an extremely small thermal expansion, the coefficient of which is about $3.5 \times 10^{-6}/°C$. in the temperature range of a room temperature to 250° C. Thus, it is required that the material intended for the supporting electrode plate bonded to a semiconductor silicon substrate should exhibit a low thermal expansion, the coefficient of which is correspondingly about $3.5 \times 10^{-6}/°C$.

Additionally, the supporting electrode plate has to serve for dissipating Joule heat generated in the semiconductor body during the operation of the semiconductor device. For this reason, the material for the supporting electrode plate has to be excellent in respect of the thermal conductivity in addition to a high electrical conductivity. Such requirement may be adequately satisfied when pure Cu or an alloy thereof which has thermal and electrical conductivities approximating to those of pure Cu can be used as the material for the supporting electrode plate, whereby disadvantages ascribable to poor dissipation of Joule heat such as increased current leakage, increase in the forward voltage drop or the like performance degradations can be effectively excluded.

Heretofore, tungsten (W) or molybdenum (Mo) has been used for the supporting electrode plate and found to be effective for preventing the destruction and warping or bulging from occurring in the semiconductor substrate of Si. Tungsten (W) has a thermal expansion coefficient of about $4.4 \times 10^{-6}/°C$. in the temperature range of a room temperature to 250° C., while that of molybdenum is about $5.5 \times 10^{-6}/°C$. Thus, both material satisfy the above requirements in respect of the thermal and electrical conductivities to a reasonable degree.

It goes however without saying that further improvement on the thermal and electrical conductivities of the supporting electrode plate is desirable, since then the output of the semiconductor device can be increased with the reliability being correspondingly enhanced. In U.S. patent application Ser. No. 911,078, assigned to the assignee of the present invention a composite material composed of Cu or a Cu-alloy and carbon (C) fibers are proposed as a material for the supporting electrode plate to be used in place of W or Mo. Further, it is taught that carbon (C) fibers contained in the composite material should be preferably arrayed in a spiral or ring-like configuration at least in the surface of the electrode plate at which the electrode plate is bonded to the semiconductor body or substrate. The electrode plate of the composite material which includes Cu and 30% by volume of carbon in form of spiral carbon fibers arrayed substantially coaxially exhibits electrical conductivity of about 50 IACS% which is of course significantly higher than those of W and Mo, i.e. 30 to 35 IACS%. Besides, the coefficient of thermal expansion in the radial direction of the spiral carbon fibers is about $5 \times 10^{-6}/°C$. and more generally $4.5 \sim 5.3 \times 10^{-6}/°C$. in the temperature range of a room temperature to 250° C. which coefficient is substantially same as those of W and Mo. In this manner, the composite material disclosed in U.S. Patent Application described above allows the thermal and electrical conductivities of the electrode to be enhanced while maintaining the thermal expansion coefficient substantially equal to those of W and Mo.

It should however be mentioned that difficulties have hitherto been encountered in manufacturing the electrode plate of the composite material in which the carbon fibers are spirally and coaxially incorporated. In reality, there is a great demand for establishing a method of fabricating the supporting electrode plate of the composite material in a facilitated manner.

SUMMARY OF THE INVENTION

An object of the present invention is to provide a method of fabricating a supporting electrode plate for a semiconductor device of a composite material incorporating spirally and coaxially arrayed carbon fibers in a matrix of Cu or a Cu-alloy.

In view of the above and other objects which will become apparent as description proceeds, there is proposed according to a general aspect of the invention a method of fabricating a supporting electrode plate for a semiconductor device which comprises steps of coating the outer surface of carbon fiber with copper or a copper alloy, winding a bundle containing a plurality of the carbon fibers around a core rod under tension, subjecting the carbon fibers in the state of being wound around the core rod to a hot press processing in a non-oxidizing atmosphere, with causing mutual diffusion of copper or copper alloy coated on the carbon fibers to each other and forming a plate, and shaping the plate in a desired form for a supporting electrode.

DESCRIPTION OF THE PREFERRED EMBODIMENTS

Figure 1:
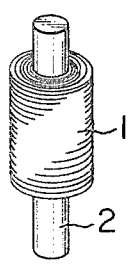
FIG. 1 is a perspective view to illustrate carbon fibers coated with copper in the state of being wound around a core rod or mandrel.

According to the teachings of the invention, a plurality of carbon fibers each having coated with copper (Cu) or copper alloy are bundled and wound around a core rod or mandrel and subsequently only the carbon fibers are subjected to a hot press treatment in the state of being wound about the mandrel thereby to bond together the contacting surfaces of the coats of Cu or Cu-alloy. According to such process, it has been found that turns of spiral carbon fibers can be positively arrayed in a substantially concentric circular array with eccentricity being essentially excluded. On the contrary, if the carbon fiber winding is hot-pressed after removal of the mandrel, the center turn of the spiral will deviate from the position defined by the core rod or mandrel. Such deviation has been found to occur in most of the carbon fiber windings which have undergone the hot press treatment without being supported on the mandrel and can be visibly observed.

When the mandrel is made purely of copper (Cu), the winding of the Cu-coated carbon fibers around the mandrel under tension may possibly deform the mandrel due to soft property thereof. With view to preventing such deformation, it may be made that the carbon fiber bundle is first wound around a mandrel of a rigid material and thereafter the rigid mandrel is replaced by a rod made purely of Cu. If the carbon fiber bundle is wound around the mandrel under no tension, the spiral turns of the carbon fibers tend to be deformed from an annular or circular concentric array. If such deformation or deviation should occur in the carbon fiber spirals, anisotropy will be produced in respect of the thermal expansion coefficient distribution in the radial direction of the supporting electrode plate. More specifically, the electrode plate will exhibit a thermal expansion coefficient substantially equal to that of silicon or tungsten or molybdenum or lower than the latter is a certain radial direction, while in other radial directions the thermal expansion coefficient of the supporting electrode plate becomes much greater than that of tungsten (W) or molybdenum (Mo) and differs from the thermal expansion coefficient of silicon (Si). Under these conditions, Si-plate having such electrode plate bonded by soldering will be cracked or warped in a complicated profile in the course of being cooled after the soldering.

It will thus be appreciated that maintaining the carbon fiber spirals in a concentric circular array without incurring deviation of center is very important for attaining the desired effects. To this end, it is required to wind the carbon fibers each coated with copper or an alloy thereof around a mandrel under tension and subsequently subject the carbon fiber bundle to the hot press treatment in the state of being wound around the mandrel thereby to bond together the contacting areas of the copper or copper alloy coats through mutual diffusion. Describing in more detail the reasons for the necessity of winding the carbon fibers under tension and using the mandrel in the hot press, it should be noted that the carbon fiber bundle wound around the mandrel will undergo contraction in ¼ to 1/6 of the original size. Further, the carbon fibers can not be uniformly or homogeneously wound notwithstanding the use of the mandrel, involving necessarily dense and coarse portions. Thus, upon hot-pressing, copper as well as carbon will tend to flow into the coarse portion. Such tendency will become more remarkable when the mandrel is not used, resulting in that the axis of the spiral array of the carbon fibers is deviated from the center of the electrode plate. Besides, if the fiber bundle is wound loosely around the mandrel under no tension, many small gaps will be produced between the turns of the winding, and copper as well as carbon will flow into the gaps, involving deformation of the spiral from a circular array into an ellipsoidal form or waved profile.

The magnitude of tension applied as the carbon fibers coated with Cu or Cu-alloy are wound should preferably be varied in dependence on the diameter of the carbon fiber bundle as well as types of coating process. Breakage of carbon fibers during the winding around the mandrel must be evaded to an absolute certainty. The coating fiber surfaces with Cu or Cu-alloy may be effected by a plating process. Alternatively, the carbon fiber bundle may be immersed in a slurry containing pulverized Cu or Cu-alloy admixed in an aqueous solution of methylcellulose thereby to allow the carbon fiber bundle to be impregnated with the slurry. Further, after having been plated, the carbon fibers may be immersed in the slurry.

After having been coated with Cu or Cu-alloy, several thousands of fibers are bundled, squeezed by hand and wound around a core rod or mandrel.

By way of example, carbon fibers having a diameter of 6 to 9 $\mu$m are coated with Cu by plating in thickness of about 1 $\mu$m. When about 6,000 fibers are bundled together and squeezed by hand, it is possible to attain the diameter of the bundle on the order of 1 mm although it depends on the squeezing manner. The tension under which the fiber bundle thus obtained is wound around the mandrel should preferably be in a range of 700 to 1,300 gf. When the tension is smaller than 700 gf, it is difficult to wind the fiber bundle without involving any slack, as a result of which deformation of the spiral configuration of the carbon fibers is observed in the surface of the fabricated electrode plate after the hot press or in a sectional plane of the electrode plate parallel to the faces subjected to the hot press. On the other hand, when the tension is greater than 1,300 gf, the carbon fibers in the bundle are often broken.

When 6,000 carbon fibers each having a diameter of 6 to 9 $\mu$m are bundled, immersed in the slurry containing pulverized Cu admixed in an aqueous solution of methylcellulose to allow the bundle to be impregnated with the slurry and squeezed once by hand, the diameter of the bundle becomes equal to about 5 mm when the quantity or content of Cu is about 30% by volume, although the diameter may vary in dependence on the viscosity of the slurry. The tension under which the fiber bundle thus obtained is wound around a mandrel is preferably in the range of 100 to 700 gf and more preferably in the range of 100 to 300 gf. The tension under which the bundle of carbon fibers plated with Cu and subsequently immersed in the slurry of pulverized Cu admixed in the aqueous solution of methylcellulose is wound around the mandrel after having been squeezed by hand may be substantially same as is in the former case where the coating is effected only by immersing the bundle in the slurry. On the basis of the criteria described above, a bundle of 3,000 carbon fibers each coated with Cu-layer through plating in thickness of about 1 $\mu$m, for example, may be wound under tension in the range of 350 to 650 gf which corresponds to a half of the tension employed in the cases described above.

When the carbon fiber bundle has been wound around the mandrel, then the hot press is effected with the mandrel being left in the wound state or alternatively replaced by another mandrel.

For the hot press treatment, temperature, pressure and ambient atmosphere are influential factors. The temperature should be higher than the recrystallization temperature of Cu or Cu-alloy. When the temperature is higher than the recrystallization point, Cu or Cu-alloy becomes softened, whereby the mutual diffusion of Cu or Cu-alloy at the contacting areas is promoted, while formation of the electrode plate is facilitated. The upper limit of the hot-press temperature should be so selected that no melting may occur. In general, the upper limit is set at a temperature below the melting point. Temperature higher than 500° C. is preferred. In this case, the carbon fiber density of the electrode plate formed after the hot press treatment can be made to approximate to the theoretical density by employing an appropriate pressure level.

Higher hot-press pressure is preferred. The lower limit of pressure is determined in consideration of the carbon fiber density to be attained as well as the temperature to be employed. In general, pressure higher than 200 kg/cm$^2$ at the temperature higher than 700° C. allows the density approximating to the theoretical value to be attained.

The ambient atmosphere should be of a non-oxidizing nature or nitrogen atmosphere. At the presence of oxidizing atmosphere, Cu or Cu-alloy applied to the carbon fibers as the coats as well as the mandrel tend to be significantly oxidized to exert adverse influence to the mutual diffusion, eventually making it impossible to implement the electrode in a single integral plate. On the other hand, when the atmosphere exhibits extremely strong reducing action, the mandrel and Cu or Cu-alloy will adhere to each other prior to the hot press treatment which is thus made difficult to be effected. More specifically, although, in the state in which the carbon fiber bundle is wound around the mandrel, the surfaces of Cu or Cu-alloy coats on the carbon fibers as well as the surface of the mandrel are in general slightly oxidized, when the assembly is exposed to an atmosphere exhibiting a strong reducing action, the slightly oxidized surfaces described above are rapidly reduced, as the result of which the Cu coats or Cu-alloy coats and the mandrel adhere to each other. Accordingly, the hot press treatment will cause the mandrel to be simultaneously pressed, whereby the mandrel is bent to deviate from the center position. These drawbacks can be overcome by using a nitrogen atmosphere.

When the hot press treatment has been completed, the mandrel is cut off along the surface of the electrode plate of the composite material containing carbon fibers in the matrix of Cu or Cu-alloy. In this connection, it should be mentioned that when the slurry containing pulverized Cu or Cu-alloy in the aqueous solution of methylecellulose is used, the assembly of carbon fiber bundle wound around the mandrel should preferably be exposed to a reducing atmosphere after the hot pressing treatment thereby to reduce oxides produced due to presence of moisture in the slurry.

Further, it is preferred that the electrode plate formed after the hot press or after the mandrel having been cut off be heated to a temperature higher than the recrystallization temperature of Cu or Cu-alloy but lower than the melting point thereof. By virtue of such heating, Cu or Cu-alloy becomes softened, as a result of which the carbon fibers which have been confined stationarily tends to be loosened to take a stable state. At that time, partial bulging may occur. By removing the bulges through polishing, such bulging will never be produced again, even when the electrode plate is heated afterward to the temperature of the degree described above, which means that the bonding of the electrode plate to a semiconductor device by soldering will not give rise to the bulging of the electrode plate.

The heating treatment for preventing the possible bulging described above may be effected after the hot press by removing the pressing pressure before the molded plate has been cooled below the recrystallization temperature.

The material of the mandrel to be usable for hot pressing treatment must meet the following requirements:

(a) The material for mandrel should have a melting point higher than the hot press temperature.

(b) The material must be capable of effecting mutual diffusion or forming a chemical compound with the coat material of carbon fibers at the hot press treatment or at the heating treatment after the hot press.

(c) The thermal expansion coefficient of the mandrel material should be smaller or at least not excessively higher than that of the composite electrode plate in the axial direction thereof.

Unless the above requirements are fulfilled, the coating material of the carbon fibers will be prevented from being bonded to the mandrel, involving a danger that the mandrel be accidentally removed. Further, when the thermal expansion coefficient of the mandrel is considerably higher than that of the electrode plate in the axial or pressing direction, the mandrel will tend to project beyond the surfaces of the supporting electrode plate under heating at the time of soldering or during the operation of the semiconductor device, thereby to possibly destroy the semiconductor device. In general, the mandrel should be made purely of copper which is excellent in respect of the thermal and electrical conductivities.

When the mandrel or core rod made of a material excellent in the thermal and electrical conductivities such as pure copper is employed, the performance of the supporting electrode is improved over the one in which simply the carbon fibers are spirally and concentrically arrayed. More specifically, the electrical conductivity as well as the thermal conductivity are increased in the current flowing direction, whereby the capability of dissipating Joule heat produced in the semiconductor body can be correspondingly enhanced.

According to another embodiment of the invention, a ring made of a material which meets the same requirements as imposed on the mandrel material may be prepared in addition to the mandrel and fitted around the carbon fibers each coated with Cu or Cu-alloy and wound around the mandrel. Subsequently, carbon fibers coated with Cu or Cu-alloy may be wound around the ring, if desired, and then the assembly is subjected to the hot press treatment. With such structure, the thermal and electrical conductivities of the electrode plate in the current flow direction can be further improved. The carbon content of carbon fibers coated with Cu or Cu-alloy and wound around the mandrel may differ from that of the carbon fibers wound around the ring.

For bonding the supporting electrode plate finished in the manner described above to a semiconductor body or substrate by soldering, it is preferred that annuluses of carbon fibers are present in the outer peripheral surface of the supporting electrode plate. If the outer peripheral surface of the electrode is formed of only Cu or Cu-alloy, the thermal expansion of the electrode peripheral portion becomes greater than that of the semiconductor body, resulting in that the associated portion of the semiconductor body would possibly be cracked. The presence of the carbon fiber annuluses in the peripheral portion of the electrode does exclude such disadvantage.

EXAMPLE 1

Figure 2:
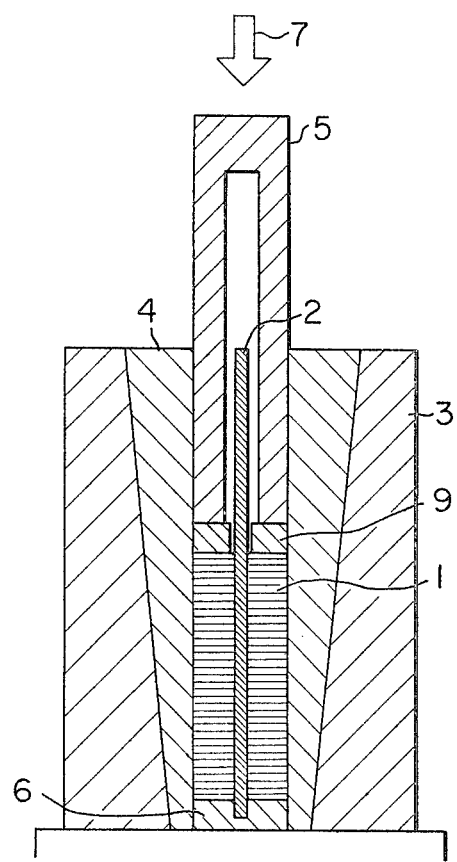
FIG. 2 is a sectional view illustrating the carbon fibers wound around the mandrel in the state of being disposed in a hot-press device.
Figure 3:
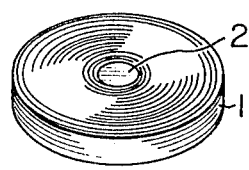
FIG. 3 is a perspective view showing a supporting electrode plate fabricated according to an embodiment of the present invention.

About 6,000 carbon fibers each having a diameter of about 9 $\mu$m and coated with pure copper in thickness of about 1 $\mu$m were bundled and potted in a slurry containing admixed Cu powder in an aqueous solution of methylcellulose. After having taken out from the slurry, the bundle was squeezed once by hand to a diameter of about 3 mm and wound around a mandrel or core rod of Cu having a diameter of 3 mm. The winding was automatically carried out by using a winding machine under tension of 200 gf. After the winding, the bundle wound on the mandrel was heated in the ambient atmosphere at about 80° C. to dry the slurry. FIG. 1 shows the state in which the Cu-coated carbon fiber bundle 1 has been wound around a mandrel or core rod 2. The carbon content was selected at 30% by volume of the total quantity of Cu and carbon fibers constituting the composite material. The assembly shown in FIG. 1 was disposed in a hot press device as is shown in FIG. 2, and hot press treatment was carried out in the atmosphere of nitrogen gas at 900° C. The hot press device is composed of an outer mold 3, an inner mold 4, an upper punch 5 and a lower punch 6, all made of graphite. The mandrel 2 was inserted into a center bore formed in the lower punch member 6. A ring 9 was inserted between the carbon fiber bundle 1 and the bottom end of the upper punch 5 to prevent eccentric displacement of an upper end portion of the mandrel 2. The hot press treatment was effected by pressing the upper punch 5 having an inner bore of 3.2 mm in diameter in the direction indicated by an arrow 7 at a pressure of 280 Kg/cm$^2$ and holding the pressing state for an hour. Simultaneously with the stoppage of heating, the upper punch 5 was pulled upwardly and the atmosphere of nitrogen was replaced by a hydrogen gas to reduce any produced oxides. After the removal from the press device, the mandrel 2 is cut off along the faces formed by the hot press treatment. The electrode plate was thus implemented in a form of a disc having a diameter of 29 mm and a thickness of 40 mm. After having annealed the electrode disc at 900° C., a finishing step was performed such that a finished supporting electrode plate of a disc of 25 mm in diameter and 4.6 mm in thickness was formed. When viewed in a top plan of the flat surface of the disc, it could be clearly observed that carbon fibers were distributed spirally and concentrically around the core rod 2 of pure copper having a diameter of 3 mm. FIG. 3 schematically illustrates the distributed pattern of carbon fibers. The mandrel or core rod was bonded to copper costs on the carbon fibers, while copper coats were integrally bonded together at the contacting areas through mutual diffusion.

Figure 4:
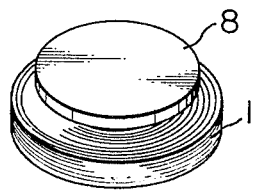
FIG. 4 is a perspective view to illustrate a structure in which a supporting electrode plate fabricated according to an embodiment of the invention is soldered to a semiconductor silicon substrate.

The electrode disc was secured to a semiconductor silicon plate or substrate 8 by soldering for use as the semiconductor device supporting electrode. This state is illustrated in FIG. 4. The Si-plate was 0.2 mm thick. The soldering was effected by using Pb-5 wt.% Sn alloy solder at a temperature in a range of 300° to 310° C. The bonded electrode disc was closely fitted onto the Si-plate in appearance and no fault could be observed. When magnified by a microscope, a slight bulge in the radial direction was found. However, the height of the bulge was at most 4 $\mu$m which is practically negligible. The electrical conductivity of the disc electrode in the axial direction was 50 IACS%, while the linear thermal expansion coefficient in the axial direction was $16.5 \sim 17.8 \times 10^{-6}$ in the temperature range of a room temperature to 250° C., and the linear thermal expansion coefficient in the radial direction was $4.8 \times 10^{-6}$.

EXAMPLE 2

By using a mandrel or core rod 2 made of pure copper and having a diameter of 8 mm, a supporting electrode disc for a semiconductor device was fabricated under the same conditions as the preceding example 1 and bonded to a Si-plate. Similar results have been obtained.

EXAMPLE 3

Figure 5:
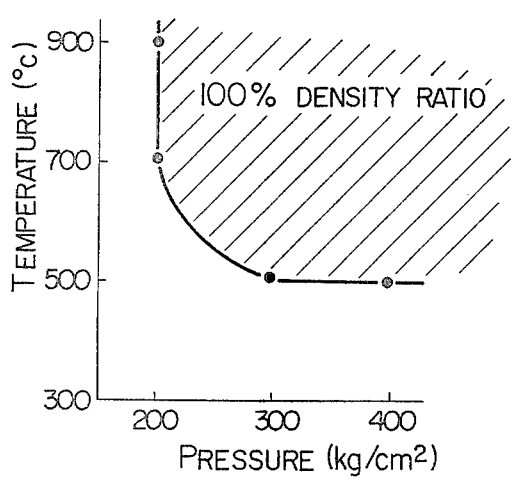
FIG. 5 graphically illustrates a relationship between temperature and pressure for hot-pressing to attain a plate having a density ratio of 100%.

In the preceding example 1, pressure and temperature for hot press treatment were varied to study how the carbon density of the finished disc differs from the theoretical value determined by calculation. The results are graphically illustrated in FIG. 5.

As the temperature for the hot press treatment is increased, higher carbon density can be attained at a correspondingly low pressure. In order to obtain the density approximating to the theoretical value i.e. density ratio of about 100%, pressure and temperature are selected so as to fall within a region indicated by shaded area in FIG. 5. When the hot press temperature is higher than 700° C., then pressing pressure of 200 Kg/cm$^2$ is sufficient for the successful hot press treatment.

EXAMPLE 4

Figure 6:
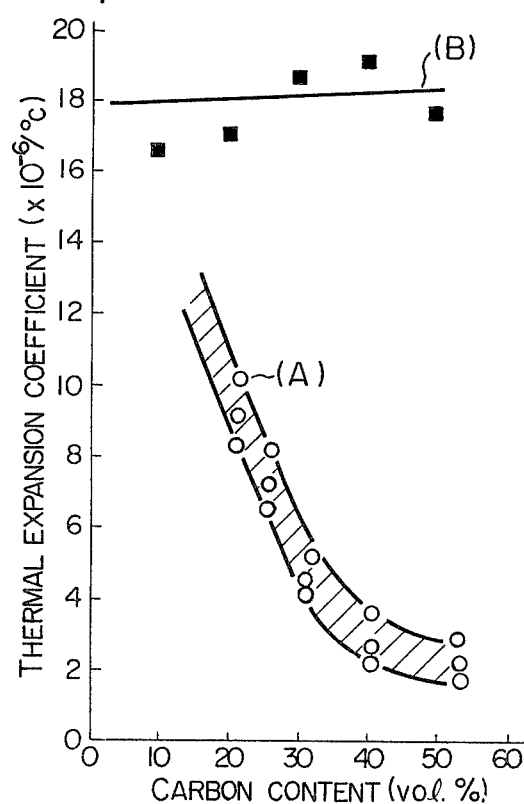
FIG. 6 graphically illustrates a relationship between quantity of carbon and thermal expansion coefficient in a semiconductor supporting electrode plate manufactured according to an embodiment of the invention.

In the preceding example 1, the quantity of pure Cu-powder admixed to the aqueous solution of methylcellulose in which the carbon fibers plated purely with copper are potted as well as the potting duration of the carbon fiber bundle were changed thereby to vary the copper quantity. Hot press treatment was carried out under the same conditions as those in the example 1. A disc of 25 mm in diameter and 4.6 mm in thickness was produced. The electrical conductivity of the finished disc in the axial direction was about 35 IACS% for the carbon content of 40% by volume and about 30 IACS% for the carbon content of 50 by volume. The linear thermal expansion coefficients of the disc in the radial and axial directions at a temperature in the range of a room temperature to 250° C. are graphically illustrated in FIG. 6 by curve A and B, respectively. As can be seen from curve A in FIG. 6, the linear thermal expansion coefficient in the radial direction of the disc is decreased as the content of carbon fibers is increased. On the other hand, the linear thermal expansion coefficient in the axial direction tends to be progressively increased as the carbon fiber content is increased, as can be seen from the curve B. The linear thermal expansion coefficient in the radial direction (curve A) was measured on several samples and found to fall within the shaded area in FIG. 6.

As will be appreciated from the foregoing description, the supporting electrode plate for a semiconductor device according to the invention which is made of a composite material containing carbon fibers in a matrix of Cu or Cu-alloy in a spiral and concentric circular array and in which a mandrel or core rod having high thermal and electrical conductivities such as rod of pure copper is disposed at the center of the electrode plate allows the thermal and electrical conductivities to be significantly improved over those of the hitherto known tungsten or molybdenum electrode plate without increasing the thermal expansion coefficient as compared with the latter. For fabricating the improved electrode plate, it is required to wind the carbon fibers coated with copper around a core rod under tension and subject to hot press treatment in a non-oxidizing atmosphere, thereby to prevent the carbon fiber spirals or annuluses from becoming eccentric and/or being disturbed in the concentric array.

We claim:

1. A method of fabricating a supporting electrode plate for a semiconductor device, comprising steps of coating surfaces of carbon fibers with copper, winding a bundle of said carbon fibers around a core rod under tension, hot-pressing said carbon fibers in the state of being wound around said core rod in a non-oxidizing atmosphere thereby to effect mutual diffusion at contacting areas of said copper coated on said carbon fibers and form an integral electrode plate, and finishing said electrode plate in a desired form for said supporting electrode plate.

2. A method as set forth in claim 1, wherein said non-oxidizing atmosphere employed in said hot-pressing is an nitrogen gas atmosphere.

3. A method as set forth in claim 1, wherein said step of hot-pressing is carried out at a temperature which is higher than recrystallization temperature of copper coated on said carbon fibers but lower than melting point of copper.

4. A method as set forth in claim 1, wherein said bundle of carbon fibers is wound around said core rod under tension of a magnitude at which no breakage of said carbon fibers occurs.

5. A method as set forth in claim 1, wherein said core rod is made of a material which is capable of effecting mutual diffusion with copper coated on said carbon fibers and which has a thermal expansion coefficient substantially equal to or smaller than that of copper.

6. A method as set forth in claim 1, wherein said core rod is made purely of copper.

7. A method as set forth in claim 1, wherein said step of coating said carbon fibers with copper is effected through plating.

8. A method as set forth in claim 1, wherein said step of coating said carbon fibers with copper comprises coating said carbon fibers with copper through plating and subsequently immersing a bundle of the resulted carbon fibers in a slurry containing copper powder admixed in an aqueous solution of methylcellulose.

9. A method as set forth in claim 1, wherein said non-oxidizing atmosphere employed in said hot-pressing is provided by an atmosphere exhibiting no reducing property and wherein after said hot-pressing step said integral electrode plate is subjected to a reducing atmosphere.

10. A method as set forth in claim 1, wherein the temperature at which said carbon fibers are hot-pressed is higher than the recrystallization temperature of copper but lower than the melting point thereof, and wherein said temperature is maintained even after said hot-pressing step.

11. A method as set forth in claim 1, wherein said step of coating said carbon fibers with copper is effected by immersing said bundle of carbon fibers into a slurry containing pulverized copper admixed in an aqueous solution of methylcellulose.

* * * * *